United States Patent
Nabekura et al.

(10) Patent No.: US 8,643,023 B2
(45) Date of Patent: Feb. 4, 2014

(54) LIGHT EMITTING DIODE, LIGHT EMITTING DIODE LAMP, AND LIGHTING APPARATUS

(75) Inventors: Wataru Nabekura, Chichibu (JP); Ryouichi Takeuchi, Chichibu (JP)

(73) Assignee: Showa Denko K.K., Tokyo (JP)

( * ) Notice: Subject to any disclaimer, the term of this patent is extended or adjusted under 35 U.S.C. 154(b) by 0 days.

(21) Appl. No.: 13/321,351

(22) PCT Filed: May 13, 2010

(86) PCT No.: PCT/JP2010/003239
§ 371 (c)(1),
(2), (4) Date: Nov. 18, 2011

(87) PCT Pub. No.: WO2010/134298
PCT Pub. Date: Nov. 25, 2010

(65) Prior Publication Data
US 2012/0080689 A1    Apr. 5, 2012

(30) Foreign Application Priority Data

May 22, 2009    (JP) ................. 2009-124048

(51) Int. Cl.
H01L 33/44    (2010.01)
(52) U.S. Cl.
USPC ............ 257/76; 257/99; 257/94; 257/77; 257/E33.023; 257/E33.062; 156/230; 345/87; 313/586; 313/587
(58) Field of Classification Search
USPC ............ 438/22, 518; 257/76, 91, 99, 98, 103, 257/13, 89, 777; 362/231, 227
See application file for complete search history.

(56) References Cited

U.S. PATENT DOCUMENTS 5,612,548 A * 3/1997 Saito et al. ............... 257/77
6,661,823 B1 * 12/2003 Otoma et al. ............. 372/49.01
(Continued)

FOREIGN PATENT DOCUMENTS

JP    06-326360 A    11/1994
JP    07-094777 A    4/1995
(Continued)

OTHER PUBLICATIONS

JP 2007173534 A, English Translation, Jul. 2007, Takeuchi, Ryoichi.*
(Continued)

*Primary Examiner* — Jerome Jackson, Jr.
*Assistant Examiner* — Bo Fan
(74) *Attorney, Agent, or Firm* — Sughrue Mion, PLLC

(57) ABSTRACT

A light-emitting diode having a high output, high efficiency, and a long service life under a high-humidity environment is provided. The light-emitting diode (1) includes a compound semiconductor layer (2) having a light-emitting section (7), ohmic electrodes (4, 5) provided on the main light extraction surface of the compound semiconductor layer (2), and an electrode protection layer (6) for protecting the ohmic electrodes (4, 5), wherein the Al concentrations of the surfaces ($2a$, $2b$) of the compound semiconductor layer (2), which include the main light extraction surface, are 20% or less and the As concentration of the surfaces ($2a$, $2b$) is less than 1%, and the electrode protection layer (6) has a two-layer structure composed of a first protective film (12) provided so as to cover the ohmic electrodes (4, 5) and a second protective film (13) provided so as to cover at least an end portion of the first protective film (12).

15 Claims, 4 Drawing Sheets

(56) References Cited

U.S. PATENT DOCUMENTS

| | | |
|---|---|---|
| 2001/0024088 A1* | 9/2001 | Justel et al. ............ 313/587 |
| 2002/0047520 A1* | 4/2002 | Juestel et al. ............ 313/586 |
| 2003/0052328 A1 | 3/2003 | Uemura |
| 2003/0179169 A1* | 9/2003 | Izumi ............ 345/87 |
| 2004/0040645 A1* | 3/2004 | Bottari ............ 156/230 |
| 2005/0211989 A1 | 9/2005 | Horio et al. |
| 2006/0180819 A1* | 8/2006 | Kim et al. ............ 257/94 |
| 2008/0185609 A1 | 8/2008 | Kozawa et al. |
| 2009/0121584 A1* | 5/2009 | Nishimura et al. ....... 310/313 B |

FOREIGN PATENT DOCUMENTS

| | | |
|---|---|---|
| JP | 08-298341 A | 11/1996 |
| JP | 09-037648 A | 2/1997 |
| JP | 3230638 B2 | 11/2001 |
| JP | 2002-027831 A | 1/2002 |
| JP | 2004-221042 A | 8/2004 |
| JP | 2006-005378 A | 1/2006 |
| JP | 2006-041403 | 2/2006 |
| JP | 2007-173534 A | 7/2007 |
| JP | 2009-049266 | 3/2009 |
| WO | 2006/043422 A1 | 4/2006 |

OTHER PUBLICATIONS

JP 2006005378 A, English Translation, Jan. 2006, Kamimura, Toshiya.*

International Search Report dated Jun. 15, 2010 for PCT/JP2010/003239.

Japanese Office Action issued on Nov. 27, 2012 from the Japanese Patent Office in Japanese Application No. 2009-124048.

Office Action dated Sep. 4, 2013 from the People's Republic of China Patent Office in a counterpart Chinese Application No. 201080021864.1.

* cited by examiner

LIGHT EMITTING DIODE, LIGHT EMITTING DIODE LAMP, AND LIGHTING APPARATUS

CROSS REFERENCE TO RELATED APPLICATION

This application is a National Stage of International Application No. PCT/JP2010/003239 filed May 13, 2010, claiming priority based on Japanese Patent Application No. 2009-124048, filed May 22, 2009, the contents of all of which are incorporated herein by reference in their entirety.

TECHNICAL FIELD

The present invention relates to a light-emitting diode and a light-emitting diode lamp and in particular, to a red light-emitting diode which is used under a high-humidity environment, such as a light source for plant growth, and a light-emitting diode lamp and a lighting apparatus which use the light-emitting diode.

BACKGROUND ART

In recent years, plant growth using an artificial light source has been studied. In particular, attention is being paid to a cultivation method using lighting by a light-emitting diode (LED) which has excellent monochromaticity and in which energy saving, long service life, and a reduction in size are possible. Further, from previous study results, as one of luminescence wavelengths suitable for a light source for plant growth (photosynthesis), the effects of red light having a wavelength range of 600 nm to 700 nm have been confirmed. Further, there is also a report that infrared light in a range of 730 nm to 760 nm is also an effective wavelength for cultivation control. In particular, with respect to photosynthesis, light having a wavelength of around 660 nm to 670 nm is the most desirable light source having high reaction efficiency. With respect to these wavelengths, in an existing light-emitting diode, a light-emitting layer made of AlGaAs on a GaAs substrate has been put to practical use (for example, Patent Documents 1 to 3).

On the other hand, a compound semiconductor LED provided with a light-emitting layer made of aluminum gallium indium phosphide (composition formula: $(Al_XGa_{1-X})_YIn_{1-Y}P$ ($0 \leq X \leq 1$ and $0 < Y \leq 1$)) is known. In this LED, the peak wavelength which is obtained by yellow-green to red light-emitting layers is around 560 nm to 670 nm.

Further, a light-emitting section provided with the light-emitting layer made of $(Al_XGa_{1-X})_YIn_{1-Y}P$ ($0 \leq X \leq 1$ and $0 < Y \leq 1$) generally has been formed on a gallium arsenide (GaAs) single crystal substrate. There is a problem in that the gallium arsenide (GaAs) single crystal substrate is optically opaque to luminescence which is emitted from the light-emitting layer and is not very strong mechanically. Therefore, in order to obtain a visible LED having higher brightness, research aimed at improvement in mechanical strength of an additional element has been carried out. That is, a technique of constituting a so-called junction type LED has been disclosed in which after an opaque substrate material such as GaAs is removed, a support layer made of a transparent material capable of transmitting luminescence and also having superior mechanical strength than that in the past is joined again (refer to Patent Document 4, for example).

Further, with respect to a high-performance protective film for providing countermeasures against high humidity of a light-emitting diode, a two-layer structure using an inorganic film and a thermosetting resin film has been proposed (refer to Patent Document 5, for example).

Further, with respect to a high-functioning protective film of an AlGaAs-based light-emitting diode, a method of forming a protective film having a sufficient film thickness greater than 100 nm on a semiconductor layer has been proposed (refer to Patent Document 6, for example).

[Patent Document 1] Japanese Unexamined Patent Application Publication No. 9-37648
[Patent Document 2] Japanese Unexamined Patent Application Publication No. 2002-27831
[Patent Document 3] Japanese Unexamined Patent Application Publication No. 2004-221042
[Patent Document 4] Japanese Patent No. 3230638
[Patent Document 5] Japanese Unexamined Patent Application Publication No. 8-298341
[Patent Document 6] Japanese Unexamined Patent Application Publication No. 7-94777

DISCLOSURE OF INVENTION

Heretofore, since LEDs have been used outdoors, their reliability with respect to high temperatures or high humidity has been examined. Furthermore, in order to be put into practical use in a new use as a light source for plant growth, qualities of withstanding high humidity or chemical substances, such as sprinkling of water or spraying of chemicals, that is, a plant growing environment, are required. Incidentally, in the AlGaAs-based LED, which is an existing light-emitting diode, since the Al concentration is high, there is a problem in that AlGaAs crystals oxidize under a high-humidity environment, so that the luminescence output is lowered. Further, in the AlGaAs-based LED, there is a case where a phenomenon occurs in which forward voltage (VF) rises due to corrosion of an alloy layer by the alloying of an ohmic electrode material and an AlGaAs material.

Therefore, with respect to the above problem, forming protective films on an AlGaAs surface and an alloy layer of an ohmic electrode has also been examined. However, in a high-output AlGaAs chip of a GaAs substrate removal type, since a side surface and a back surface are transparent AlGaAs, protection of all the surfaces is technically difficult.

Further, for example, in a high-humidity environment in which chemical substances such as chlorine are contained in moisture, there is a case where an electrochemical reaction occurs in the vicinity of an electrode, so that enhancement of the protection of the alloy layer is required.

On the other hand, in the case of edible plant growth, with respect to AlGaAs in which the possibility of corrosion is present, scrupulous attention to the behavior of As is required. Therefore, there is a problem in which countermeasures against As in a chip, a package, or a light apparatus are required. Preferably, there is also a desire to reduce the As concentration.

That is, the above AlGaAs light-emitting diode having high luminous efficiency has a structure in which a transparent AlGaAs thick-film layer is grown and a used GaAs substrate is removed. In the high-output light-emitting diode, all of the top surface, the side surface, and the back surface are AlGaAs. Since a light-emitting layer for a wavelength of 660 nm is $(Al_XGa_{1-X})As$ (X=0.35), a cladding layer and a thick-film layer with the light-emitting layer interposed therebetween are inevitably transparent layers (Al concentration is high) with a large band gap. Therefore, in the composition of $(Al_XGa_{1-X})As$, the value of the above X must exceed 0.35, and the composition of the top surface, the side surface, and the back surface is (0.5<X<0.8) and is a high concentration in a range of about 25% to 40% in terms of Al concentration. Therefore, since the AlGaAs light-emitting diode has a surface material which is easily oxidized under a high-humidity environment, a technique of forming a $SiO_2$ protective film or the like on the surface has been put to practical use. Further, also with respect to the alloy layer of a corrosion-prone ohmic electrode, a technique of forming a protective film has been put to practical use.

On the other hand, in a near-infrared region in which the luminescence wavelength is longer than 700 nm, since the Al concentration of the light-emitting layer becomes low, the Al concentration of the entire LED can be lowered, so that resistance to high humidity is improved. Therefore, this is a more important issue with respect to a red light-emitting diode.

Further, in a case where a high-temperature and high-humidity current-carrying test has been performed on the above AlGaAs light-emitting diode under the conditions of, for example, 60° C., 90 RH %, 20 mA, and 1000 hours, depending on a test package, the lowering of a luminescence output or the rising of forward voltage occurs. This is considered to be caused by an increase in light absorption in an oxide layer formed by the surface oxidation of AlGaAs (including the side surface) and an increase in resistance due to partial corrosion of an ohmic electrode and an alloy layer of a semiconductor. Further, it is known that an oxidation and corrosion reaction is accelerated by an electrochemical reaction under the conditions of containing active impurities such as alkali or halogen in addition to moisture.

The present invention has been made in view of the above-mentioned circumstances and has an object to provide a light-emitting diode having a high output, high efficiency, and a long service life under a high-humidity environment. In particular, the present invention provides a light-emitting diode suitable for lighting for plant growth in a high-humidity environment.

Further, the present invention has an object to provide a light-emitting diode lamp suitable for lighting for plant growth or a lighting apparatus in which the light-emitting diode lamp is mounted.

Solution to Problem

That is, the present invention relates to the following.

[1] A light-emitting diode including: a compound semiconductor layer having a pn-junction type light-emitting section which includes Al in a composition formula and in which the luminescence wavelength is not less than 570 nm and not more than 700 nm; an ohmic electrode provided on the main light extraction surface of the compound semiconductor layer; and an electrode protection layer for protecting the ohmic electrode, wherein Al concentrations of the surfaces of the compound semiconductor layer which include the main light extraction surface are 25% or less, and the electrode protection layer has a two-layer structure composed of a first protective film provided so as to cover the ohmic electrode, and a second protective film provided so as to cover at least an end portion of the first protective film.

[2] The light-emitting diode according to the above 1, wherein the ohmic electrode provided on the main light extraction surface is a p-type ohmic electrode.

[3] The light-emitting diode according to the above 1 or 2, wherein the light-emitting section includes a light-emitting layer having a composition formula, $(Al_XGa_{1-X})_YIn_{1-Y}P$ ($0 \le X \le 1$ and $0 \le Y \le 1$).

[4] The light-emitting diode according to the above 3, wherein the light-emitting section has a cladding layer on one or both of the upper surface and the lower surface of the light-emitting layer.

[5] The light-emitting diode according to any one of the above 1 to 4, wherein a composition formula of the surface of the above main light extraction surface is $(Al_XGa_{1-X})_YIn_{1-Y}P$ ($0 \le X \le 8$ and $0.48 \le Y \le 0.52$).

[6] The light-emitting diode according to any one of the above 1 to 5, wherein an n-type ohmic electrode is further provided on the main light extraction surface, and the electrode protection layer is provided on the n-type ohmic electrode.

[7] The light-emitting diode according to any one of the above 1 to 6, wherein the first protective film is a metal layer made of any one of gold and platinum, or a laminated structure of the metal layers.

[8] The light-emitting diode according to the above 7, wherein the surface of the first protective film is gold.

[9] The light-emitting diode according to any one of the above 1 to 8, wherein the second protective film is an oxide film or a nitride film which is transparent to the luminescence wavelength.

[10] The light-emitting diode according to the above 9, wherein the second protective film is silicon oxide ($SiO_2$).

[11] The light-emitting diode according to any one of the above 1 to 10, wherein the surface of the first protective film is made to be a pad for wire bonding.

[12] The light-emitting diode according to any one of the above 1 to 11, wherein a functional substrate is joined to the surface on the opposite side to the main light extraction surface of the compound semiconductor layer, and an Al concentration of the surface of the functional substrate is 25% or less.

[13] The light-emitting diode according to any one of the above 1 to 12, wherein the functional substrate is transparent to the luminescence wavelength.

[14] The light-emitting diode according to the above 12 or 13, wherein a material of the functional substrate is GaP.

[15] The light-emitting diode according to any one of the above 1 to 14, wherein the light-emitting diode is a light-emitting diode for use for the promotion of photosynthesis in plant growth, in which the luminescence wavelength is in a range of 650 nm to 670 nm, wherein an Al concentration of the surfaces of a semiconductor layer and a substrate is 25% or less and there is no As content with the exception of in a contact layer of the ohmic electrode.

[16] A light-emitting diode lamp including: the light-emitting diode according to any one of the above 1 to 15.

[17] Lighting equipment including: the light-emitting diode lamp according to the above 16.

Advantageous Effects of Invention

In the light-emitting diode according to the invention, the Al concentration of the surfaces including the main light extraction surface of the compound semiconductor layer having the pn-junction type light-emitting section which includes Al in a composition formula and in which the luminescence wavelength is not less than 570 nm and not more than 700 nm, is 25% or less and also the electrode protection layer for protecting the ohmic electrode provided on the main light extraction surface of the compound semiconductor layer is made in a two-layer structure composed of the first protective film provided so as to cover the ohmic electrode, and the second protective film provided so as to cover at least an end portion of the first protective film. In this manner, since the concentration in the semiconductor surface of Al which becomes the starting point of corrosion under a high-humidity environment is defined and an alloy layer of the interface between the ohmic electrode and the semiconductor is protected by the protective film of a two-layer structure, corrosion resistance of the light-emitting diode can be improved. Therefore, a light-emitting diode having a high output, high efficiency, and long service life under a high-humidity environment can be provided. In addition, in the invention, the Al concentration of the semiconductor surface is set to represent the Al concentration of the main extraction surface of the compound semiconductor layer and the surface of the functional substrate and to exclude the surface of the alloy layer between the ohmic electrode and the semiconductor.

Further, in the light-emitting diode according to the invention, since the surfaces of the compound semiconductor layer which include the main light extraction surface do not contain As, a light-emitting diode suitable for lighting for plant growth can be provided.

Further, the light-emitting diode according to the invention is provided with the light-emitting section which includes the light-emitting layer having a composition formula, $(Al_XGa_{1-X})_YIn_{1-Y}P$ ($0 \leq X \leq 1$ and $0 \leq Y \leq 1$). Since the light-emitting layer having the above composition has a lower Al and As concentration than a light-emitting layer made of AlGaAs of an existing light-emitting diode, the light-emitting diode can be suitably used as a light-emitting diode for plant growth under a severe usage environment such as a high-humidity environment.

Incidentally, a blue light-emitting diode and a red light-emitting diode are packaged in a light source for plant growth. However, in such a package, silicone resin which does not easily deteriorate with respect to blue light is used as a protective film. However, since the silicone resin generally has high hygroscopicity, the function of the silicone resin as the protective film is not sufficient in a high-humidity environment in which a light source for plant growth is used.

According to the light-emitting diode lamp and the lighting apparatus of the invention, since the above light-emitting diode is mounted, they can be used as a light source for plant growth in which blue and red light-emitting diodes are simultaneously used.

DESCRIPTION OF EMBODIMENTS

Figure 1:
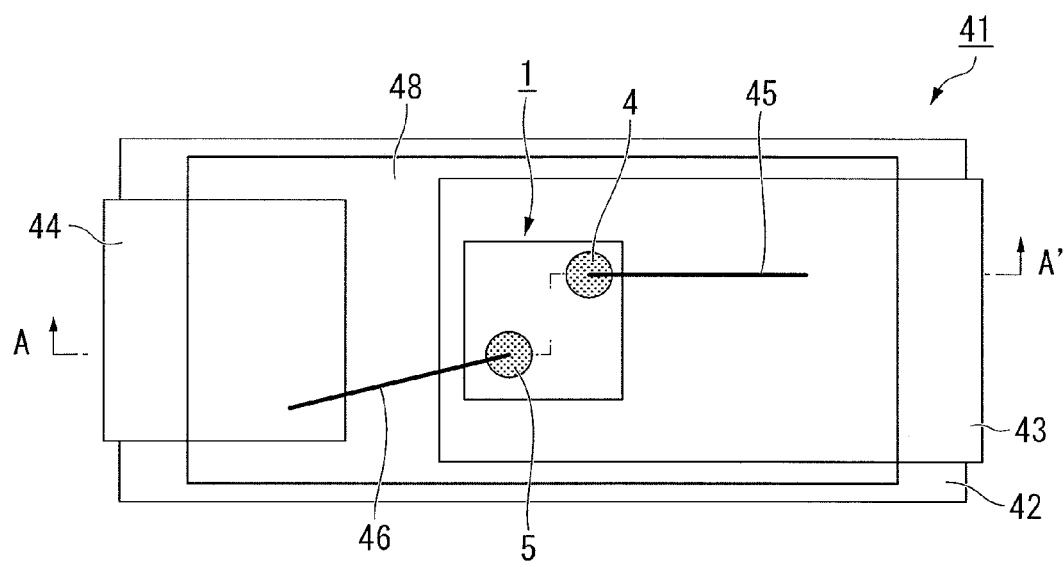
FIG. 1 is a plan view of a light-emitting diode lamp using a light-emitting diode related to an embodiment of the invention.

Hereinafter, a light-emitting diode related to an embodiment to which the invention is applied will be described in detail along with a light-emitting diode lamp using the light-emitting diode by using the drawings. In addition, in the drawings which are used in the following description, there is a case where characteristic sections are enlarged and shown for convenience in order to facilitate the understanding of features, and the size ratio or the like of each constituent element is not necessarily the same as the actual condition.

Light-Emitting Diode Lamp

Figure 2:
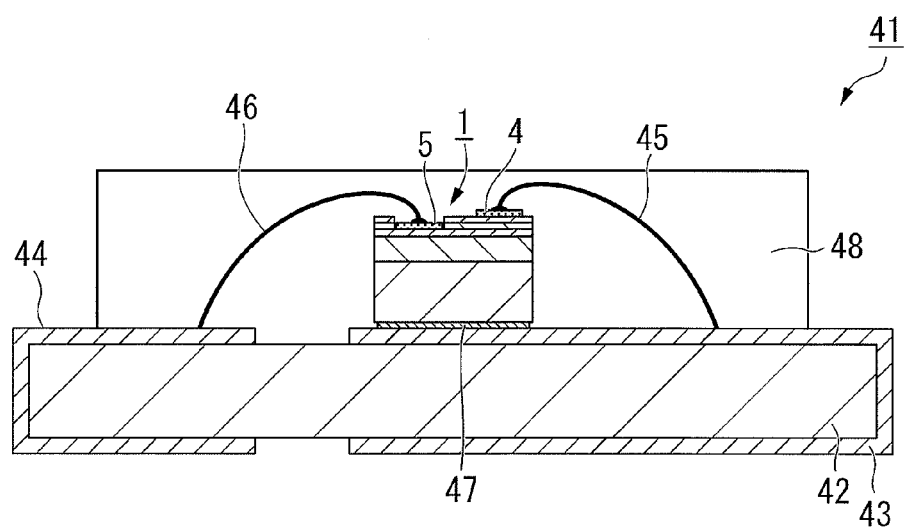
FIG. 2 is a cross-sectional schematic view taken along line A-A' in FIG. 1 of the light-emitting diode lamp using the light-emitting diode related to the embodiment of the invention.

FIGS. 1 and 2 are diagrams for describing a light-emitting diode lamp using a light-emitting diode related to an embodiment to which the invention is applied, wherein FIG. 1 is a plan view and FIG. 2 is a cross-sectional view along line A-A' shown in FIG. 1.

As shown in FIGS. 1 and 2, in a light-emitting diode lamp 41 using a light-emitting diode 1 of this embodiment, one or more of the light-emitting diodes 1 are mounted on the surface of a mount substrate 42. More specifically, on the surface of the mount substrate 42, an n-electrode terminal 43 and a p-electrode terminal 44 are provided. Further, an n-type ohmic electrode 4 that is a first electrode of the light-emitting diode 1 and the n-electrode terminal 43 of the mount substrate 42 are connected to each other by using a gold wire 45 (wire bonding). On the other hand, a p-type ohmic electrode 5 that is a second electrode of the light-emitting diode 1 and the p-electrode terminal 44 of the mount substrate 42 are connected to each other by using a gold wire 46. Further, as shown in FIG. 2, on the surface on the opposite side to the surface on which the n-type and p-type ohmic electrodes 4 and 5 of the light-emitting diode 1 are provided, a connection layer 47 is provided, and the light-emitting diode 1 is connected onto the n-electrode terminal 43 by the connection layer 47, thereby being fixed to the mount substrate 42. The surface of the mount substrate 42, on which the light-emitting diode 1 is mounted, is sealed by a general silicone resin 48.

Light-Emitting Diode

Figure 3:
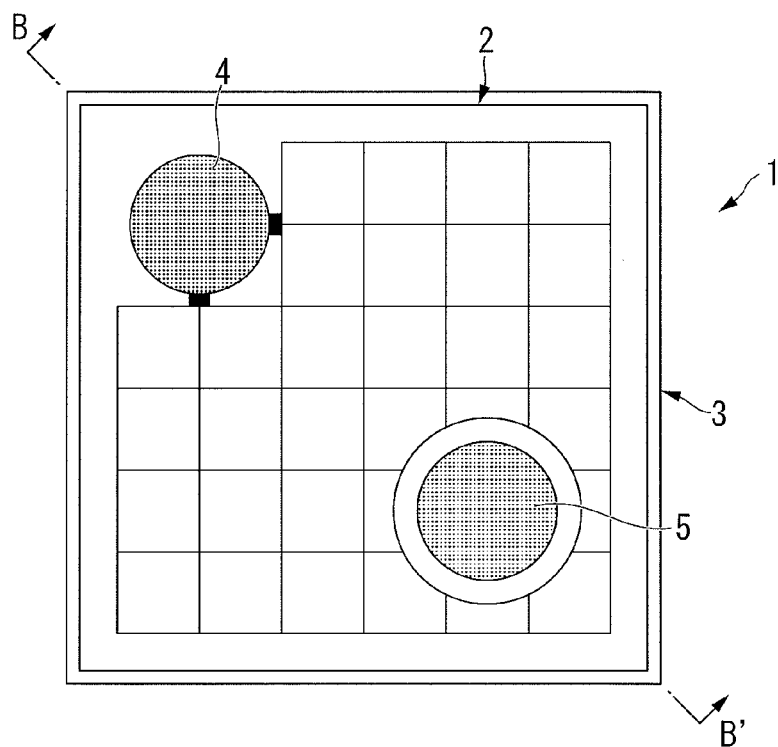
FIG. 3 is a plan view of the light-emitting diode related to the embodiment of the invention.
Figure 4:
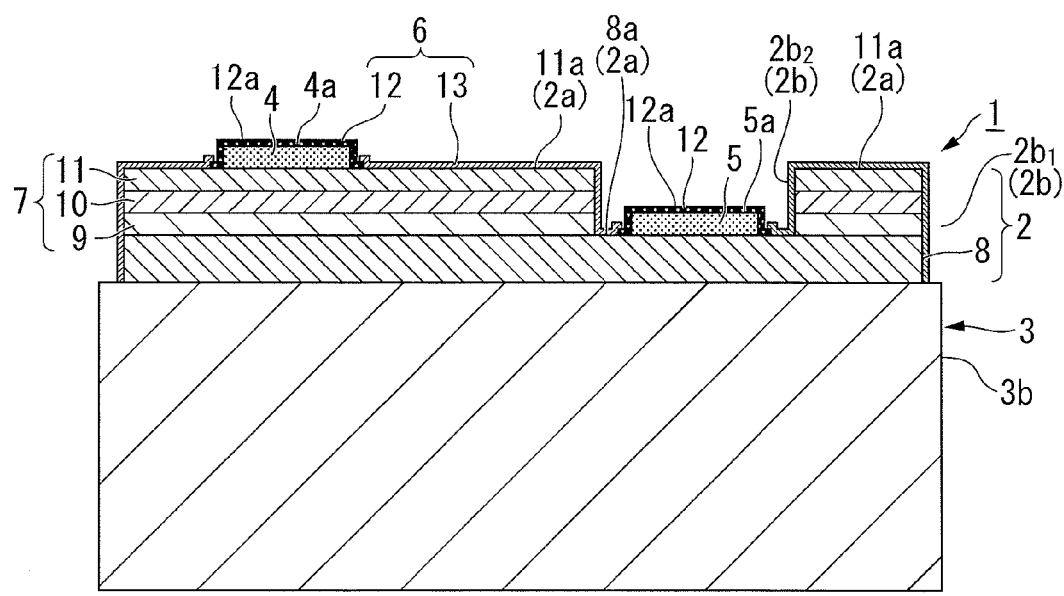
FIG. 4 is a cross-sectional schematic view taken along line B-B' in FIG. 3 of the light-emitting diode related to the embodiment of the invention.

FIGS. 3 and 4 are diagrams for describing the light-emitting diode related to the embodiment to which the invention is applied, wherein FIG. 3 is a plan view and FIG. 4 is a cross-sectional view along line B-B' shown in FIG. 3. As shown in FIGS. 3 and 4, the light-emitting diode 1 of this embodiment is a light-emitting diode in which a compound semiconductor layer 2 and a functional substrate 3 are joined to each other. Then, the light-emitting diode 1 is schematically configured to include the n-type and p-type ohmic electrodes 4 and 5 provided on the main light extraction surface of the compound semiconductor layer 2, and an electrode protection layer 6 for protecting the n-type and p-type ohmic electrodes 4 and 5. In addition, the main light extraction surface in this embodiment means the surface on the opposite side to the surface to which the functional substrate 3 is attached, in the compound semiconductor layer 2.

The compound semiconductor layer (also called an epitaxial growth layer) 2 has a structure in which a pn-junction type light-emitting section 7 which includes Al in a composition formula and in which the luminescence wavelength is not less than 570 nm and not more than 700 nm, and a current diffusion layer 8 for diffusing an element driving current in a planar manner in the whole of the light-emitting section are sequentially stacked, as shown in FIG. 4. A known functional layer can be added to the structure of the compound semiconductor layer 2 on a timely basis. For example, it is possible to provide a known layer structure such as a contact layer for reducing contact resistance of the ohmic electrodes, or a current blocking layer or current constriction layer for restricting an area through which an element driving current flows. In addition, it is preferable that the compound semiconductor layer 2 be a layer formed by epitaxial growth on a GaAs substrate.

The light-emitting section 7 has a configuration in which at least a p-type lower cladding layer 9, a light-emitting layer 10, and an n-type upper cladding layer 11 are sequentially laminated on the current diffusion layer 8, as shown in FIG. 4. That is, in order to obtain high-intensity luminescence, it is preferable that the light-emitting section 7 be made to be a so-called double hetero (DH) structure which includes the lower cladding layer 9 and the upper cladding layer 11 disposed to confront each other on the lower side and the upper side of the light-emitting layer 10 in order to "confine" a carrier leading to radiation recombination, and luminescence in the light-emitting layer 10.

The light-emitting layer 10 is constituted by a semiconductor layer having a composition formula, $(Al_XGa_{1-X})_YIn_{1-Y}P$ ($0 \leq X \leq 1$ and $0 < Y \leq 1$). The light-emitting layer 10 may also be any of a double hetero structure, a single quantum well (SQW) structure, and a multiple quantum well (MQW) structure. However, in order to obtain excellent monochromatic luminescence, it is preferable that the light-emitting layer 10 be made to be the MQW structure. Further, the composition of $(Al_XGa_{1-X})_YIn_{1-Y}P$ ($0 \leq X \leq 1$ and $0 < Y \leq 1$) which constitutes a barrier layer and a well layer which form a quantum well (QW) structure can be determined such that a quantum level leading to a desired luminescence wavelength is formed in the well layer.

It is preferable that the layer thickness of the light-emitting layer 10 be in a range of 0.02 μm to 2 μm. Further, a conduction type of the light-emitting layer 10 is not particularly limited and any of an un-doped type, a p type, and an n type can be selected. In order to increase luminous efficiency, it is preferable to make the light-emitting layer 10 be the un-doped type having excellent crystallinity or have a carrier concentration of less than $3 \times 10^{17}$ cm$^{-3}$.

The light-emitting diode 1 which includes the light-emitting layer 10 having a composition formula, $(Al_XGa_{1-X})_YIn_{1-Y}P$ ($0 \leq X \leq 1$ and $0 < Y \leq 1$), has a high output compared to an existing AlGaAs-based light-emitting diode, and a wavelength range of 650 nm to 670 nm can be suitably used for lighting (a light-emitting diode lamp or a lighting apparatus provided with the light-emitting diode lamp) which is used for the promotion of photosynthesis in plant growth. In addition, the lighting apparatus means a lighting apparatus provided with, although it is not shown, at least a substrate in which a wiring, a through-hole, or the like is formed, a plurality of light-emitting diode lamps mounted on the surface of the substrate, and a reflector or a shade having a cross-sectional shape in the form of a concave and constituted such that a light-emitting diode lamp is mounted on a bottom portion of the inside of the concave portion.

The lower cladding layer 9 and the upper cladding layer 11 are respectively provided on the lower surface and the upper surface of the light-emitting layer 10, as shown in FIG. 4. Specifically, the lower cladding layer 9 is provided on the lower surface of the light-emitting layer 10 and the upper cladding layer 11 is provided on the upper surface of the light-emitting layer 10.

The lower cladding layer 9 and the upper cladding layer 11 are constituted such that polarities are different from each other. Further, with respect to the carrier concentration and the thicknesses of the lower cladding layer 9 and the upper cladding layer 11, known preferred ranges can be used, and it is preferable to optimize conditions such that the luminous efficiency of the light-emitting layer 10 is increased.

Specifically, as the lower cladding layer 9, it is preferable to use a semiconductor material made of, for example, Mg-doped p-type $(Al_XGa_{1-X})_YIn_{1-Y}P$ ($0.3 \leq X \leq 1$ and $0 < Y \leq 1$). Further, with respect to the carrier concentration, a range of $2 \times 10^{17}$ cm$^{-3}$ to $2 \times 10^{18}$ cm$^{-3}$ is preferable, and with respect to the layer thickness, a range of 0.5 μm to 5 μm is preferable.

On the other hand, as the upper cladding layer 11, it is preferable to use a semiconductor material made of, for example, Si-doped n-type $(Al_XGa_{1-X})_YIn_{1-Y}P$ ($0.3 \leq X \leq 1$ and $0 < Y \leq 1$). Particularly, in a case where the upper surface of the upper cladding layer 11 becomes a surface on the main light extraction surface side of the light-emitting diode 1, it is preferable that the value of the above X be not less than 0.3 and not more than 1.0 (as the surface concentration of Al, not less than 7.5 and not more than 25%), and it is more preferable that it be 0.8 or less (as the surface concentration of Al, 20% or less). Further, it is preferable that the above Y be not less than 0.48 and not more than 0.52.

Further, with respect to the carrier concentration, a range of $1 \times 10^{17}$ cm$^{-3}$ to $1 \times 10^{18}$ cm$^{-3}$ is preferable, and with respect to the layer thickness, a range of 0.5 μm to 5 μm is preferable. In addition, the polarities of the lower cladding layer 9 and the upper cladding layer 11 can be appropriately selected in consideration of an element structure of the compound semiconductor layer 2.

Further, intermediate layers for slowly changing band discontinuity between both layers may also be provided between the lower cladding layer 9 and the light-emitting layer 10, between the light-emitting layer 10 and the upper cladding layer 11, and between the upper cladding layer 11 and the current diffusion layer 8. In this case, it is preferable that each intermediate layer be composed of a semiconductor material having a forbidden band width intermediate to that of between both the layers.

Further, a known layer structure such as a contact layer for reducing contact resistance of the ohmic electrodes, or a current blocking layer or current constriction layer for restricting an area through which an element driving current flows, can be provided above the constitution layer of the light-emitting section 7. In addition, as the contact layer, for example, GaAs having a small band gap is generally used. In contrast, it is preferable to use GaInP as a material of a contact layer which does not contain As.

The current diffusion layer 8 is provided below the light-emitting section 7 in order to diffuse an element driving current in a planar manner in the whole of the light-emitting section 7, as shown in FIG. 4. In this way, the light-emitting diode 1 can uniformly emit light from the light-emitting section 7.

As the current diffusion layer 8, a material having a composition of $(Al_XGa_{1-X})_YIn_{1-Y}P$ ($0 \leq X \leq 0.7$ and $0 \leq Y \leq 1$) can be applied. Although the above X also depends on an element structure of the compound semiconductor layer 2, since a material having a low Al concentration is chemically stable, it is preferable that the above X be 0.5 or less (as an Al concentration, about 12.5% or less), and it is more preferable that it be 0. Further, it is preferable that the above Y be 1. That is, as the current diffusion layer 8, it is preferable that an Al concentration be 25% or less, it is more preferable that it be 15% or less, and it is most preferable to use GaP which does not contain Al.

In the light-emitting diode 1 of this embodiment, the Al concentration of the surfaces of the compound semiconductor layer 2, that is, an upper surface 2a of the compound semiconductor layer 2, which is the main light extraction surface, and a side surface 2b of the compound semiconductor layer 2 is adjusted so as to become 25% or less. Specifically, this can be achieved by setting the composition of each layer constituting the compound semiconductor layer 2 to be in the above-mentioned range. In this manner, by setting the Al concentration of the surfaces including the main light extraction surface of the compound semiconductor layer to be 25% or less, when the light-emitting diode 1 is used under a high-humidity environment, it is possible to suppress corrosion due to a reaction of Al with moisture.

In addition, as shown in FIG. 4, in this embodiment, in the main light extraction surface, an upper surface 11a of the upper cladding layer 11 and an upper surface 8a of the current diffusion layer 8, which is exposed from the surface of the compound semiconductor layer 2, as will be described later, are included.

Therefore, the upper surface 2a of the compound semiconductor layer 2 is composed of the upper surface 11a of the upper cladding layer 11 and the upper surface 8a of the current diffusion layer 8. Further, the side surface 2b of the compound semiconductor layer 2 is composed of a side surface 2b₁ of an outer peripheral portion of the compound semiconductor layer 2 and a side surface 2b₂ of an opening portion provided in order to expose the upper surface 8a of the current diffusion layer 8.

Further, in the light-emitting diode 1 of this embodiment, it is preferable that the surfaces of the compound semiconductor layer 2, that is, the upper surface 2a of the compound semiconductor layer 2, which is the main light extraction surface, and the side surface 2b of the compound semiconductor layer 2 do not contain As. Specifically, this can be achieved by setting the composition of each layer constituting the compound semiconductor layer 2 to be in the above-mentioned range. In this manner, by setting the As concentration of the surfaces 2a and 2b including the main light extraction surface of the compound semiconductor layer 2 to be less than 1%, preferably, having the surfaces contain no As, even in a case where the light-emitting diode 1 is used as a light source for plant growth, it is possible to reduce countermeasures against As in a package, a lighting apparatus, or the like.

The functional substrate 3 is joined to the surface on the opposite side to the main light extraction surface of the compound semiconductor layer 2. That is, the functional substrate 3 is joined to the current diffusion layer 8 side constituting the compound semiconductor layer 2, as shown in FIG. 4. The functional substrate 3 is made of a material which has sufficient strength to mechanically support the light-emitting section 7 and in which a forbidden band width capable of transmitting luminescence which is emitted from the light-emitting section 7 is wide and which is optically transparent to the luminescence wavelength from the light-emitting layer 10. For example, the functional substrate 3 can be constituted by an insulating substrate such as a group IV semiconductor crystalline body such as gallium phosphide (GaP) or silicon carbide (SiC), glass, or sapphire.

It is preferable that the functional substrate 3 be made to have a thickness of, for example, about 50 μm or more in order to support the light-emitting section 7 with a mechanically sufficient strength. Further, in order to facilitate mechanical working of the compound semiconductor layer 2 after the functional substrate 3 is joined to the compound semiconductor layer 2, it is preferable to set the thickness of the functional substrate 3 not to exceed 300 μm. That is, it is most suitable that the functional substrate 3 be constituted by an n-type GaP substrate having a thickness of not less than about 50 μm and not more than about 300 μm.

Further, the functional substrate 3 may also have a mirror structure which reflects luminescence which is emitted from the light-emitting section 7. As the functional substrate 3 having the mirror structure, a so-called mirror substrate in which a highly-reflective metal such as Au or Ag and a semiconductor such as silicon or germanium are combined can be given as an example.

In the light-emitting diode 1 of this embodiment, it is preferable to set the Al concentration of the surface of the functional substrate 3 to be 25% or less. Adjustment of the Al concentration can be specifically achieved by setting the composition of the functional substrate 3 to be in the above-mentioned range. In this manner, by setting the Al concentration of the surface of the functional substrate 3 to be 25% or less, when the light-emitting diode 1 is used under a high-humidity environment, it is possible to suppress corrosion due to reaction of Al with moisture.

Further, in the light-emitting diode 1 of this embodiment, it is preferable to set the As concentration of the surface of the functional substrate 3 to be less than 1%, and preferably make the surface not to include As. In addition, in this embodiment, the surface of the functional substrate 3 refers to a side surface 3b which is an outer peripheral surface. However, in a case where an upper surface is exposed, naturally, it includes the upper surface.

Adjustment of the As concentration can be specifically achieved by setting the composition of the functional substrate 3 to be in the above-mentioned range. In this manner, by setting the As concentration of the surface (the side surface 3b) of the functional substrate 3 to be less than 1%, it is possible to reduce countermeasures against As in a package, a lighting apparatus, or the like in a case where the light-emitting diode 1 is used as a light source for plant growth.

The n-type ohmic electrode 4 and the p-type ohmic electrode 5 are low-resistance ohmic contact electrodes provided on the main light extraction surface of the light-emitting diode 1. Here, the n-type ohmic electrode 4 is provided above the upper cladding layer 11 and, for example, AuGe, or an alloy composed of Ni allow/Au can be used. On the other hand, the p-type ohmic electrode 5 is provided on the exposed upper surface 8a of the current diffusion layer 8, as shown in FIG. 4, and an alloy composed of AuBe/Au can be used.

Here, in the light-emitting diode 1 of this embodiment, it is preferable to form the p-type ohmic electrode 5 as the second electrode on the current diffusion layer 8. By such a configuration, the effect of lowering the operating voltage can be obtained. Further, by forming the p-type ohmic electrode 5 on the current diffusion layer 8 made of p-type GaP, excellent ohmic contact can be obtained, so that it is possible to lower the operating voltage.

In the light-emitting diode 1 of this embodiment, it is preferable to dispose the n-type ohmic electrode 4 and the p-type ohmic electrode 5 so as to be at diagonal positions, as shown in FIG. 3. Further, it is most preferable to take a configuration in which the p-type ohmic electrode 5 is surrounded by the compound semiconductor layer 2. By such a configuration, the effect of lowering the operating voltage can be obtained. Further, the p-type ohmic electrode 5 is surrounded on all four sides by the n-type ohmic electrodes 4, whereby it becomes easy for an electric current to flow in all directions, and as a result, the operating voltage is lowered.

Further, in the light-emitting diode 1 of this embodiment, it is preferable to form the n-type ohmic electrode 4 into the form of a reticulation such as a honeycomb or a grating shape, as shown in FIG. 3. By such a configuration, the effect of reducing VF or the effect of improving reliability can be obtained. Further, by forming it into the form of a grid, it is possible to uniformly inject an electric current into the light-emitting layer 10, and as a result, the effect of improving reliability can be obtained. In addition, in the light-emitting diode 1 of this embodiment, it is preferable to constitute the n-type ohmic electrode 4 by a pad-shaped electrode (a pad electrode) and an electrode of a linear shape (a linear electrode) having a width of 10 µm or less. By such a configuration, higher brightness can be attained. Further, by narrowing the width of the linear electrode, it is possible to increase an opening area of the main light extraction surface, so that it is possible to achieve higher brightness.

In addition, in the light-emitting diode 1 of this embodiment, the case of a so-called one-sided electrode structure in which the n-type ohmic electrode 4 and the p-type ohmic electrode 5 are provided on the main light extraction surface is exemplified. However, the electrode structure is not particularly limited thereto. For example, a so-called up-and-down electrode structure in which the n-type ohmic electrode 4 is provided on the main light extraction surface side and the p-type ohmic electrode 5 is provided on the bottom surface side of the functional substrate 3 is also acceptable.

Figure 5:
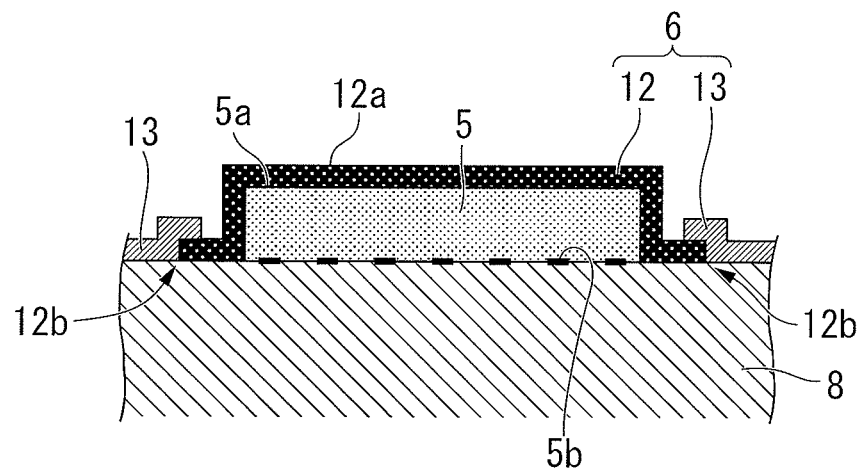
FIG. 5 is an enlarged cross-sectional view for describing the configuration of an electrode protection film of the light-emitting diode related to the embodiment of the invention.

The electrode protection layer 6 is provided so as to cover the surfaces (the upper surface 2a and the side surface 2b) of the compound semiconductor layer 2, which include the main light extraction surface, as shown in FIGS. 4 and 5. The electrode protection layer 6 is provided in order to protect the n-type and p-type ohmic electrodes 4 and 5 and has a two-layer structure composed of a first protective film 12 and a second protective film 13.

The first protective films 12 are respectively provided so as to cover the n-type ohmic electrode 4 and the p-type ohmic electrode 5, as shown in FIGS. 4 and 5. In this way, the n-type ohmic electrode 4 and the p-type ohmic electrode 5 are coated without being exposed. Further, as the first protective film 12, a metal layer made of either gold (Au) or platinum (Pt), or a laminated body of the metal layers can be used. Specifically, an alloy composed of, for example, Au/Pt/Au can be used. By providing a platinum layer having barrier properties against an impurity element, it is possible to suppress infiltration of an impurity element from an upper surface 4a of the n-type ohmic electrode 4 and an upper surface 5a of the p-type ohmic electrode 5. Therefore, as shown in FIG. 5, for example, an alloy layer 5b formed at the interface between the p-type ohmic electrode 5 and the current diffusion layer 8 can be protected. Further, by providing a gold layer on the surface of the first protective film 12, it is possible to use an upper surface 12a of the first protective film 12 as a pad for wire bonding. Further, with respect to the film thickness of the first protective film 12, it is preferable that it be in a range of 100 nm to 4000 nm, and a range of 300 nm to 3000 nm is more preferable, and a range of 500 nm to 2000 nm is further preferable.

The second protective film 13 is provided so as to cover the surfaces of the compound semiconductor layer 2, that is, the upper surface 2a that is the main light extraction surface and the side surface 2b, as shown in FIG. 4. In this way, it is possible to suppress corrosion of the surfaces of the compound semiconductor layer 2 due to moisture in a high-humidity environment.

Further, the second protective film 13 is provided so as to expose the upper surface 12a of the first protective film 12 which serves as a pad for wire bonding and also cover at least an end portion 12b of the first protective film 12, as shown in FIGS. 4 and 5. In this way, it is possible to more reliably suppress infiltration of moisture from end surfaces of the n-type ohmic electrode 4 and the p-type ohmic electrode 5.

As the second protective film 13, an oxide film or a nitride film transparent to the luminescence wavelength can be used. As the oxide film, a silicon oxide ($SiO_2$) film can be given as an example. Further, as the nitride film, a silicon nitride (SiN) film can be given as an example. With respect to the film thickness of the second protective film 13, it is preferable that it be in a range of 100 nm to 1000 nm, and a range of 200 nm to 800 nm is more preferable, and a range of 300 nm to 600 nm is further preferable.

Incidentally, in the case of using the light-emitting diode 1 under a high-humidity environment, as impurities, alkali or halogen ions, for example, chlorine ions are apt to be included in moisture. There is a problem in that with respect to chlorine ions or the like which are included in moisture, the alloy layer 5b of the p-type ohmic electrode 5 is easily corroded by an electrochemical reaction. Further, in a light-emitting diode having a one-sided electrode structure in which both of n-type and p-type electrodes are present on the surface side of a light-emitting diode, the distance between the p-type electrode and the n-type electrode is short and, structurally, corrosion by an electrochemical reaction is prone to occur. Therefore, in the light-emitting diode 1 of this embodiment having a one-sided electrode structure, it is preferable to protect at least the p-type ohmic electrode provided on the main light extraction surface, by the first protective film 12.

Method of Manufacturing Light-Emitting Diode

Figure 6:
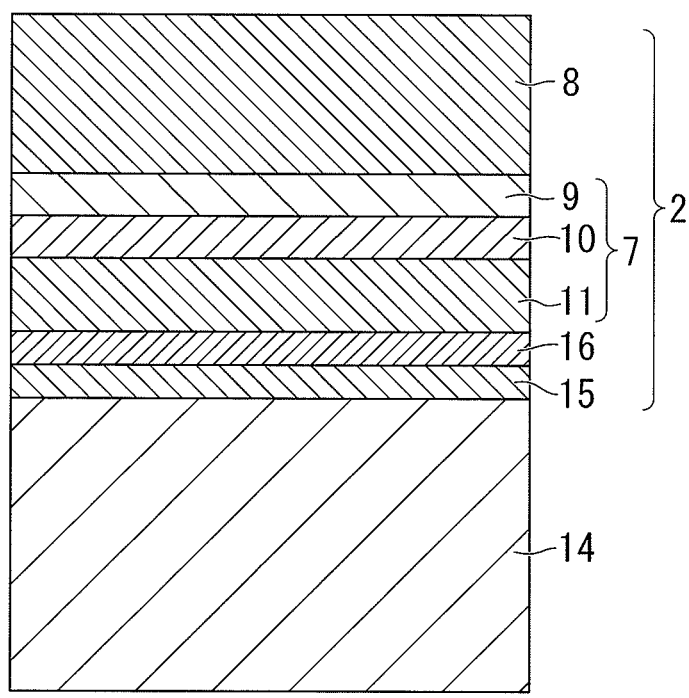
FIG. 6 is a cross-sectional schematic view of an epitaxial wafer which is used in the light-emitting diode related to the embodiment of the invention.
Figure 7:
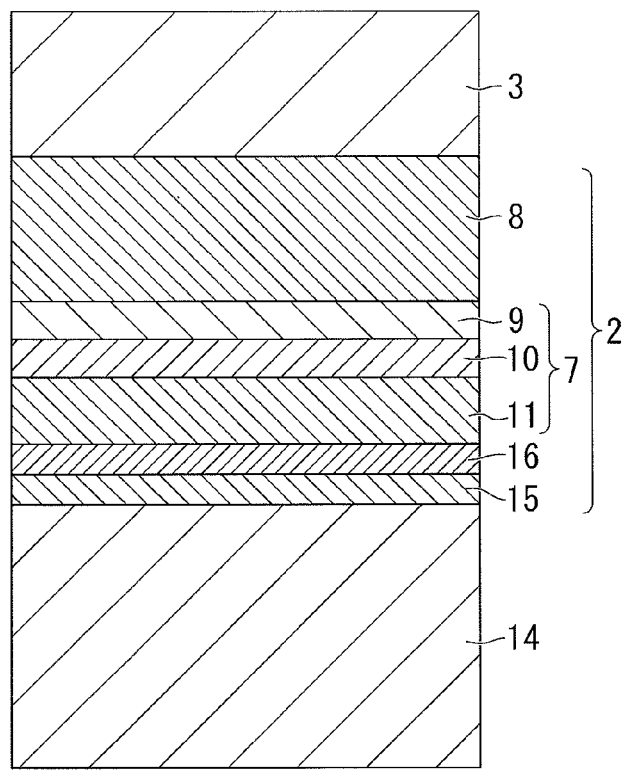
FIG. 7 is a cross-sectional schematic view of a bonded wafer which is used in the light-emitting diode related to the embodiment of the invention.

Next, a method of manufacturing the light-emitting diode 1 of this embodiment will be described. FIG. 6 is a cross-sectional view of an epitaxial wafer which is used in the light-emitting diode 1 of this embodiment. Further, FIG. 7 is a cross-sectional schematic view of a bonded wafer which is used in the light-emitting diode 1 of this embodiment.

Process of Forming Compound Semiconductor Layer

First, as shown in FIG. 6, the compound semiconductor layer 2 is made. The compound semiconductor layer 2 is made by sequentially laminating a buffer layer 15 made of GaAs, an etching stopper layer (not shown) provided in order to be used for selective etching, a contact layer 16 made of Si-doped n-type GaInP, the n-type upper cladding layer 11, the light-emitting layer 10, the p-type lower cladding layer 9, and the current diffusion layer 8 made of Mg-doped p-type GaP, on a GaAs substrate 14.

As the GaAs substrate 14, a commercially available single-crystal substrate manufactured by a known manufacturing method can be used. It is preferable that the epitaxially grown surface of the GaAs substrate 14 be smooth. With respect to the plane orientation of the surface of the GaAs substrate 14, a substrate in which epitaxial growth is easy and which is mass-produced and has a (100) plane and a plane deviated within ±20° from (100) is desirable in terms of stability of quality. Further, it is more preferable that a range of the plane orientation of the GaAs substrate 14 be 15°±5° deviated in a (0-1-1) direction from a (100) direction.

It is preferable that the dislocation density of the GaAs substrate 14 be low in order to improve the crystallinity of the compound semiconductor layer 2. Specifically, for example, 10000 pieces $cm^{-2}$ or less, preferably, 1000 pieces $cm^{-2}$ or less is suitable.

The GaAs substrate 14 may also be any of an n-type and a p-type. The carrier concentration of the GaAs substrate 14 can be appropriately selected in terms of a desired electric conductivity and an element structure. For example, in a case where the GaAs substrate 14 is a silicon-doped p-type, it is preferable that the carrier concentration be in a range of $1\times10^{17}$ cm$^{-3}$ to $5\times10^{18}$ cm$^{-3}$. In contrast, in a case where the GaAs substrate 14 is a zinc-doped p-type, it is preferable that the carrier concentration be in a range of $2\times10^{18}$ cm$^3$ to $5\times10^{19}$ cm$^{-3}$.

The buffer layer 15 is provided in order to reduce lattice mismatch between the GaAs substrate 14 and the constitution layer of the light-emitting section 7. Therefore, if the quality of a substrate or an epitaxial growth condition is selected, the buffer layer 15 is not necessarily required. Further, it is preferable that a material of the buffer layer 15 be the same material as that of the substrate which is subjected to epitaxial growth. Therefore, in this embodiment, as the buffer layer 15, it is preferable to use GaAs like the GaAs substrate 14. Further, as the buffer layer 15, in order to reduce the propagation of a defect, a multilayer film made of a material different from the GaAs substrate 14 can also be used. It is preferable that the thickness of the buffer layer 15 be 0.1 μm or more and it is more preferable that it be 0.2 μm or more.

The contact layer 16 is provided in order to lower contact resistance with an electrode. It is preferable that a material of the contact layer 16 be a material which does not contain Al, such as GaAs, and GaInP which does not contain As is most preferable. Further, it is preferable that the lower limit of the carrier concentration of the contact layer 16 be $5\times10^{17}$ cm$^{-3}$ or more in order to lower contact resistance with an electrode, and $1\times10^{18}$ cm$^{-3}$ or more is more preferable. It is preferable that the upper limit of the carrier concentration be $2\times10^{19}$ cm$^{-3}$ or less where the lowering of crystallinity easily occurs. With respect to the thickness of the contact layer 16, 0.02 μm or more is preferable and 0.05 μm or more is preferred.

In this embodiment, it is possible to apply a known growth method such as a molecular beam epitaxial method (MBE) or a low-pressure metal-organic chemical vapor deposition method (an MOCVD method). In particular, it is preferable to apply the MOCVD method having excellent mass-productivity. Specifically, in the GaAs substrate 14 which is used for the epitaxial growth of the compound semiconductor layer 2, it is preferable to remove contamination of the surface or a natural oxide film by carrying out a pretreatment such as a cleaning process or a thermal treatment before the growth.

When each layer of the compound semiconductor layer 2 is epitaxially grown, as a raw material of a group III constituent element, for example, trimethylaluminum ($(CH_3)_3Al$), trimethylgallium ($(CH_3)_3Ga$), and trimethylindium ($(CH_3)_3In$) can be used. Further, as a doping material of Mg, for example, bis-cyclopentadienyl magnesium (bis-$(C_5H_5)_2Mg$) or the like can be used. Further, as a doping material of Si, for example, disilane ($Si_2H_6$) or the like can be used. Further, as a raw material of a group V constituent element, phosphine ($PH_3$), arsine ($AsH_3$), or the like can be used. Further, as the growth temperature of each layer, in the case of using p-type GaP as the current diffusion layer 8, a temperature in a range of 720° C. to 770° C. can be applied, and in each of the other layers, a temperature in a range of 600° C. to 700° C. can be applied. Further, the carrier concentration and the layer thickness of each layer and a temperature condition can be appropriately selected.

In the compound semiconductor layer 2 made in this way, an excellent surface state in which crystal defects are few can be obtained. Further, the compound semiconductor layer 2 may also be subjected to a surface treatment such as polishing considering an element structure.

Process of Joining Transparent Substrate

Next, the compound semiconductor layer 2 and the functional substrate 3 are joined to each other. In the joining of the compound semiconductor layer 2 and the functional substrate 3, first, mirror finishing is carried out by polishing the surface of the current diffusion layer 8 constituting the compound semiconductor layer 2. Next, the functional substrate 3 which is attached to the mirror-polished surface of the current diffusion layer 8 is prepared. In addition, the surface of the functional substrate 3 is polished into a mirror surface before it is joined to the current diffusion layer 8. Next, the compound semiconductor layer 2 and the functional substrate 3 are loaded into a general semiconductor material attachment apparatus, and the mirror-polished surfaces of the two are irradiated with an Ar beam neutralized by collision of electrons in a vacuum. Thereafter, joining can be performed at room temperature by overlapping the surfaces of the two over each other and then applying a load thereto in the attachment apparatus in which the vacuum is maintained (refer to FIG. 7).

Process of Forming N-Type and P-Type Electrodes

Next, the n-type ohmic electrode 4 and the p-type ohmic electrode 5 are formed. In the formation of the n-type ohmic electrode 4 and the p-type ohmic electrode 5, first, the GaAs substrate 14 and the GaAs buffer layer 15 are selectively removed from the compound semiconductor layer 2 joined to the functional substrate 3, by an ammonia-based etchant. Next, the n-type ohmic electrode 4 is formed on the exposed surface of the contact layer 16. Specifically, after AuGe and Ni alloy/Au are laminated so as to become an arbitrary thickness by a vacuum deposition method, the shape of the n-type ohmic electrode 4 is formed by performing patterning with the use of, for example, general photolithographic means.

Next, the current diffusion layer 8 is exposed by selectively removing the contact layer 16, the upper cladding layer 11, the light-emitting layer 10, and the lower cladding layer 9, and the p-type ohmic electrode 5 is then formed on the exposed surface (the upper surface 8a). Specifically, after Au/Be/Au are laminated so as to become an arbitrary thickness by a vacuum deposition method, the shape of the p-type ohmic electrode 5 is formed by performing patterning with the use of, for example, general photolithographic means. Thereafter, by performing alloying by performing a thermal treatment in conditions of, for example, 400° C. to 500° C. and 5 minutes to 20 minutes, it is possible to form the low-resistance n-type and p-type ohmic electrodes 4 and 5. At this time, an alloy layer is formed at the interface between the semiconductor and the electrode, so that an excellent ohmic electrode can be obtained.

Process of Forming First Protective Film

Next, for example, a metal layer composed of Au/Pt/Au is laminated so as to become an arbitrary thickness by a vacuum deposition method so as to cover the n-type ohmic electrode 4 and the p-type ohmic electrode 5. Next, the first protective films 12 having shapes to cover the n-type ohmic electrode 4 and the p-type ohmic electrode 5 are respectively formed by performing patterning of the metal layer with the use of general photolithographic means. The first protective films 12 are protective films for the n-type ohmic electrode 4 and the p-type ohmic electrode 5 and also become electrodes for wire bonding. Therefore, since the electrodes for wire bonding are formed simultaneously with the formation of the first protective films 12, this is a desirable process having high productivity.

Process of Forming Second Protective Film

Next, the compound semiconductor layer 2 in an area for dicing is removed by etching. Next, after a transparent $SiO_2$ film, for example, is formed by a sputtering method, the $SiO_2$ films of places which become an electrode pad for performing wire bonding and an area to be cut by dicing are etching-removed by performing patterning with the use of general photolithographic means. In addition, as a method of forming the second protective film, a known technique such as a plasma CVD method or a sputtering method can be used. Further, as the cutting method, a method suitable for a material of the functional substrate is appropriately selected, and a dicing method or a scribing method (laser or mechanical) can also be applied. For example, in a case where a GaP substrate is used as the functional substrate, it is most preferable to apply the dicing method having high productivity.

For example, in a case where a GaP substrate is used as the functional substrate, fractured layers by dicing and contamination are etching-removed by mixed liquid of sulfuric acid and hydrogen peroxide as necessary. Further, it is preferable to add a cleaning process as necessary. In this way, the light-emitting diode 1 is manufactured.

Method of Manufacturing Light-Emitting Diode Lamp

Next, a method of manufacturing the light-emitting diode lamp 41 using the light-emitting diode 1, that is, a method of mounting the light-emitting diode 1 will be described.

As shown in FIGS. 1 and 2, a given quantity of light-emitting diodes 1 are mounted on the surface of the mount substrate 42. In the mounting of the light-emitting diode 1, first, alignment of the mount substrate 42 and the light-emitting diode 1 is performed, thereby disposing the light-emitting diode 1 at a given position on the surface of the mount substrate 42. Next, the light-emitting diode 1 is die-bonded to the surface of the mount substrate 42 by the connection layer 47 provided on the bottom surface of the light-emitting diode 1. Next, the n-type ohmic electrode 4 of the light-emitting diode 1 and the n-electrode terminal 43 of the mount substrate 42 are connected to each other by using the gold wire 45 (wire bonding). Next, the p-type ohmic electrode 5 of the light-emitting diode 1 and the p-electrode terminal 44 of the mount substrate 42 are connected to each other by using the gold wire 46. Finally, the surface of the mount substrate 42 on which the light-emitting diode 1 is mounted is sealed by a general silicone resin (general epoxy resin or the like is also acceptable) 48. In this way, the light-emitting diode lamp 41 using the light-emitting diode 1 is manufactured.

As described above, in the light-emitting diode 1 of this embodiment, the Al concentration of the surfaces (the upper surface 2a and the side surface 2b) including the main light extraction surface of the compound semiconductor layer 2 having the pn-junction type light-emitting section 7 which includes Al in a composition formula and in which the luminescence wavelength is not less than 570 nm and not more than 700 nm, is 25% or less and also the electrode protection layer 6 for protecting the n-type and p-type ohmic electrodes 4 and 5 provided on the main light extraction surface of the compound semiconductor layer 2 is made in a two-layer structure composed of the first protective film 12 provided so as to cover the n-type and p-type ohmic electrodes 4 and 5, and the second protective film 13 provided so as to cover at least an end portion of the first protective film 12. In this manner, since the concentration in the semiconductor surface of Al which becomes the starting point of corrosion under a high-humidity environment is defined and the alloy layer 5b (refer to FIG. 5) of the interface between the n-type and p-type ohmic electrodes 4 and 5 and the semiconductor is protected by the protective film of a two-layer structure, corrosion resistance of the light-emitting diode 1 can be improved. Therefore, the light-emitting diode 1 having a high output, high efficiency, and a long service life under a high-humidity environment can be provided.

Further, in the light-emitting diode 1 of this embodiment, since the surfaces (the upper surface 2a and the side surface 2b) of the compound semiconductor layer 2, which include the main light extraction surface, do not contain As, the light-emitting diode 1 suitable for lighting for plant growth can be provided.

Further, the light-emitting diode 1 of this embodiment is provided with the light-emitting section 7 which includes the light-emitting layer 10 having a composition formula, $(Al_XGa_{1-X})_YIn_{1-Y}P$ ($0 \leq X \leq 1$ and $0 \leq Y \leq 1$). Since the light-emitting layer 10 having the above composition has lower Al and As concentrations than a light-emitting layer made of AlGaAs of an existing light-emitting diode, the light-emitting diode 1 can be suitably used as a light-emitting diode for plant growth under a severe usage environment such as a high-humidity environment.

According to the light-emitting diode lamp 41 and the lighting apparatus of this embodiment, since the above light-emitting diode 1 is mounted, they can be suitably used as a light source for plant growth in which blue and red light-emitting diodes are simultaneously used.

EXAMPLE

Hereinafter, the effects of the invention will be specifically described using an example. In addition, the invention is not limited to this example.

In this example, an example of manufacturing the light-emitting diode according to the invention is specifically described. Further, the light-emitting diode manufactured in this example is a red light-emitting diode having an AlGaInP light-emitting section. In this example, the light-emitting diode was manufactured by joining a compound semiconductor layer grown on a GaAs substrate to a functional substrate made of GaP. Then, for characteristic evaluation, a light-emitting diode lamp in which a light-emitting diode chip is mounted on a substrate was manufactured.

Example 1

In a light-emitting diode of Example 1, first, an epitaxial wafer was manufactured by sequentially laminating compound semiconductor layers on a GaAs substrate made of an Si-doped n-type GaAs single crystal. In the GaAs substrate, a plane inclined by 15° in a (0-1-1) direction from a (100) plane was set to be a growth plane and a carrier concentration was set to be $2 \times 10^{18}$ cm$^{-3}$. The compound semiconductor layers are an n-type buffer layer made of Si-doped GaAs, an n-type contact layer made of Si-doped $Ga_{0.5}In_{0.5}P$, an n-type upper cladding layer made of Si-doped $(Al_{0.7}Ga_{0.3})_{0.5}In_{0.5}P$, a light-emitting layer/barrier layer composed of a pair of undoped $Ga_{0.44}In_{0.56}P/(Al_{0.53}Ga_{0.47})_{0.5}In_{0.5}P$, a p-type lower cladding layer made of Mg-doped $(Al_{0.7}Ga_{0.3})_{0.5}In_{0.5}P$, a thin-film intermediate layer made of $(Al_{0.5}Ga_{0.5})_{0.5}In_{0.5}P$, and a current diffusion layer made of Mg-doped p-type GaP.

In this example, the epitaxial wafer was formed by making the compound semiconductor layers epitaxially grow in the GaAs substrate having a diameter of 76 mm and a thickness of 350 μm with the use of a low-pressure metal-organic chemical vapor deposition apparatus (MOCVD apparatus). When making epitaxial growth layers grow, as a raw material of a group III constituent element, trimethylaluminum ($(CH_3)_3Al$), trimethylgallium ($(CH_3)_3Ga$), and trimethylindium ($(CH_3)_3In$) were used. Further, as a doping material of Mg, bis-cyclopentadienyl magnesium (bis-$(C_5H_5)_2Mg$) was used. Further, as a doping material of Si, disilane ($Si_2H_6$) was used. Further, as a raw material of a group V constituent element, phosphine ($PH_3$) and arsine ($AsH_3$) were used. Further, as the growth temperature of each layer, the current diffusion layer made of p-type GaP was grown at 750° C. In each of the other layers, growth was performed at 700° C.

In the buffer layer made of GaAs, a carrier concentration was set to be about $2\times10^{18}$ cm$^{-3}$ and a layer thickness was set to be about 0.5 μm. In the contact layer, a carrier concentration was set to be about $2\times10^{18}$ cm$^{-3}$ and a layer thickness was set to be about 0.05 μm. In the upper cladding layer, a carrier concentration was set to be about $1\times10^{18}$ cm$^{-3}$ and a layer thickness was set to be about 3.5 μm. The light-emitting layer was set to be undoped Ga$_{0.44}$In$_{0.56}$P having a layer thickness of about 17 nm, and the barrier layer was set to be undoped (Al$_{0.53}$Ga$_{0.47}$)$_{0.5}$In$_{0.5}$P having a layer thickness of about 19 nm. Further, a distortion light-emitting layer and a barrier layer were alternately laminated in 22 pairs. In the lower cladding layer, a carrier concentration was set to be about $8\times10^{17}$ cm$^{-3}$ and a layer thickness was set to be about 0.5 μm. In the intermediate layer, a carrier concentration was set to be about $8\times10^{17}$ cm$^{-3}$ and a layer thickness was set to be about 0.05 μm. In the current diffusion layer made of GaP, a carrier concentration was set to be about $3\times10^{18}$ cm$^{-3}$ and a layer thickness was set to be about 9 μm.

Next, the current diffusion layer was mirror-finished by polishing it up to a region which reached a depth of about 1 μm from the surface. By this mirror finishing, the roughness of the surface was made to be 0.18 nm. On the other hand, a functional substrate made of n-type GaP which is attached to the mirror-polished surface was prepared. As the functional substrate for attachment, a single crystal in which Si was added thereto such that a carrier concentration became about $2\times10^{17}$ cm$^{-3}$, and a plane orientation was set to be (111), was used. Further, the diameter of the functional substrate was 76 mm and the thickness was 250 μm. The surface of the functional substrate was finished to have a root-mean-square value (rms) of 0.12 nm by polishing it into a mirror surface before it was joined to the current diffusion layer.

Next, the functional substrate and the epitaxial wafer were loaded into a general semiconductor material attachment apparatus and the inside of the apparatus was evacuated until a vacuum of $3\times10^{-5}$ Pa was obtained.

Next, the surfaces of both the functional substrate and the current diffusion layer were irradiated with an Ar beam neutralized by collision of electrons over three minutes. Thereafter, in the attachment apparatus in which a vacuum was maintained, the surfaces of the functional substrate and the current diffusion layer were joined to each other at room temperature by overlapping the surfaces over each other and then applying a load thereto such that pressure on each surface became 50 g/cm$^2$. In this way, a bonded wafer was formed.

Next, the GaAs substrate and the GaAs buffer layer were selectively removed from the bonded wafer by an ammonia-based etchant. Next, AuGe, Ni, and Au alloy were formed on the surface of the contact layer by a vacuum deposition method such that a thickness became 0.3 μm. Thereafter, an n-type ohmic electrode was formed by performing patterning with the use of general photolithography means.

Next, the epitaxial layer in an area to form a p-type ohmic electrode was selectively removed, thereby exposing the current diffusion layer. On the exposed surface, the p-type ohmic electrode was formed by a vacuum deposition method such that AuBe became 0.2 μm and Au became 0.2 μm. Thereafter, the low-resistance p-type and n-type ohmic electrodes were formed by carrying out alloying by performing a thermal treatment at 450° C. and for 10 minutes. At this time, alloy layers each having a thickness of 0.1 μm were formed at the current diffusion layer and the contact layer, and the electrode interface.

Next, a multilayer film composed of Au having a thickness of 0.2 μm, Pt having a thickness of 0.2 μm, and Au having a thickness of 1.2 μm was formed so as to cover the n-type and p-type ohmic electrodes. Next, first protective films having shapes to cover the n-type and p-type ohmic electrodes were formed by performing patterning of the multilayer film with the use of lithography means. In addition, the first protective films double as wire bonding pads of the n-type and p-type ohmic electrodes.

Next, the compound semiconductor layer in an area which is cut by a dicing saw was removed by etching. Thereafter, a SiO$_2$ film having a thickness of 0.5 μm was formed by a sputtering method so as to cover the surface of the compound semiconductor layer. Next, SiO$_2$ in the cutting area and the bonding area was removed by a photolithography process and a second protective film was formed. In addition, in this process, a SiO$_2$ film was also formed on the side surface of the compound semiconductor layer.

Next, chipping was performed by performing cutting at intervals of 350 μm from the compound semiconductor layer side with the use of a dicing saw. Fractured layers by dicing and contamination were etching-removed by a mixed liquid of sulfuric acid and hydrogen peroxide, so that the light-emitting diode of Example 1 was manufactured. The Al concentration of the surface of the semiconductor layer was 17.5%. On the other hand, As was not contained in the surface of the semiconductor layer. Further, since the functional substrate is GaP, Al and As are not present in the side surface of the functional substrate.

Twenty pieces of the light-emitting diode lamps each having the light-emitting diode chip of Example 1 manufactured as described above mounted on a mount substrate were assembled. The light-emitting diode lamp was manufactured by wire-bonding the n-type ohmic electrode of the light-emitting diode to an n-electrode terminal provided on the surface of the mount substrate by a gold wire and wire-bonding the p-type ohmic electrode to a p-electrode terminal by a gold wire, and then performing sealing with a general silicone resin.

The evaluation results of the characteristics of the light-emitting diode (the light-emitting diode lamp) are shown in Table 1. As shown in Table 1, when an electric current flowed between the n-type and p-type ohmic electrodes, red light having a peak wavelength of 660.0 nm was emitted. A forward voltage (Vf) when an electric current of 20 mA flowed in a forward direction reflected a low resistance in the bonded interface between the current diffusion layer constituting the compound semiconductor layer and the functional substrate and an excellent ohmic characteristic of each ohmic electrode and was about 2.0 V. A luminescence output when a forward current was set to be 20 mA was 16 mW.

Further, an acceleration test by a high-temperature and high-humidity current-carrying test (60° C., 90 Rh %, and 20 mA) was performed by using the light-emitting diode lamp of Example 1. Here, water used for humidification is assumed to be for plant growth and the test was carried out under strict conditions in which water containing chlorine ions in a range of 30 ppm to 50 ppm was absorbed in resin. Excellent results were obtained in which a residual ratio of a luminescence output after 1000 hours was 97% and there was no change in VF (20 mA).

Comparative Example 1

Figure 8:
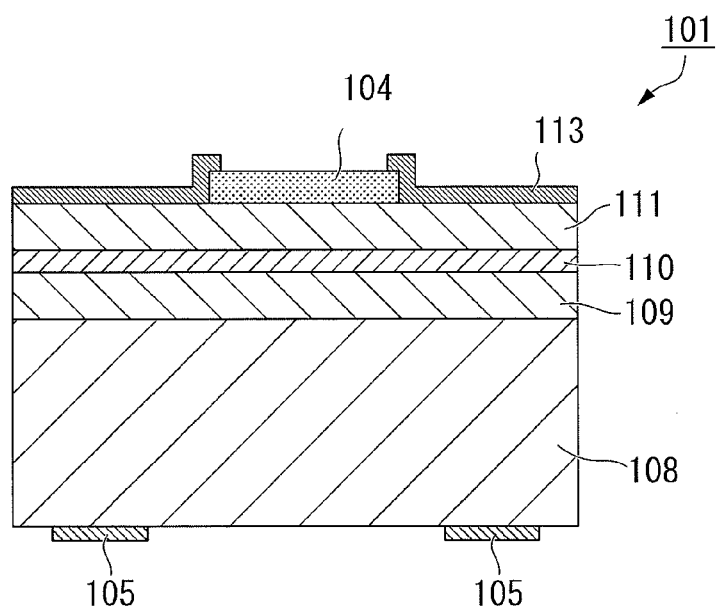
FIG. 8 is a cross-sectional schematic view for describing the configuration of a light-emitting diode of Comparative example 1 in the description of an example of the invention.

A light-emitting diode of Comparative example 1 was formed by a liquid-phase epitaxial method that is known in prior art. The light-emitting diode (symbol 101 in FIG. 8) of Comparative example 1 is a light-emitting diode changed into a light-emitting diode having a light-emitting section of a double hetero structure having an $Al_{0.35}Ga_{0.65}As$ light-emitting layer on a GaAs substrate.

In the manufacturing of the light-emitting diode of Comparative example 1, specifically, a p-type upper cladding layer (symbol 111 in FIG. 8) made of $Al_{0.7}Ga_{0.3}As$ and having a thickness of 20 μm, an undoped light-emitting layer (symbol 110 in FIG. 8) made of $Al_{0.35}Ga_{0.65}As$ and having a thickness of 2 μm, an n-type lower cladding layer (symbol 109 in FIG. 8) made of $Al_{0.7}Ga_{0.3}As$ and having a thickness of 20 μm, and an n-type thick-film layer (symbol 108 in FIG. 8) made of $Al_{0.6}Ga_{0.4}As$ transparent to the luminescence wavelength and having a thickness of 100 μm were formed on a p-type GaAs single crystal substrate having a (100) plane by a liquid phase epitaxial method. After the epitaxial growth, the GaAs substrate was removed. Next, a p-type ohmic electrode (symbol 104 in FIG. 8) having a diameter of 100 μm was formed on the surface (surface Al concentration=35% and As concentration=50%) of the p-type $Al_{0.7}Ga_{0.3}As$. Next, n-type ohmic electrodes (symbol 105 in FIG. 8) each having a diameter of 20 μm were formed at intervals of 80 μm on the back surface of the n-type $Al_{0.6}Ga_{0.4}As$. Next, an $SiO_2$ protective film (symbol 113 in FIG. 8) was formed in a thickness of 0.5 μm on a portion of the electrode and a main light extraction surface with the exception of a bonding pad. Here, the protective film formed on the p-type ohmic electrode of Comparative example 1 is a single-layer protective film in which the first protective film (symbol 12 in FIGS. 4 and 5) in the invention is not formed (refer to FIG. 8). Next, after cutting was performed at intervals of 350 μm by a dicing saw, a light-emitting diode chip of Comparative example 1 was manufactured by removing fractured layers by etching. The approximate Al concentration of the side surface was 30% and the As concentration was 50%.

The evaluation results of the characteristics of a light-emitting diode lamp in which the light-emitting diode of Comparative example 1 is mounted are shown in Table 1. As shown in Table 1, when an electric current flowed between the n-type and p-type ohmic electrodes, red light having a peak wavelength of 661.1 nm was emitted. Further, forward voltage (Vf) when an electric current of 20 mA flowed in a forward direction was about 1.9 V. Further, a luminescence output when a forward current was set to be 20 mA was 5 mW.

Further, an acceleration test by a high-temperature and high-humidity current-carrying test (60° C., 90 Rh %, and 20 mA) was performed by using the light-emitting diode lamp of Comparative example 1. Here, water used for humidification is assumed to be for plant growth and the test was carried out under strict conditions in which water containing chlorine ions in a range of 30 ppm to 50 ppm was absorbed in resin. A residual ratio of a luminescence output after 1000 hours was 77% and VF (20 mA) rose by 0.2 V. The main cause of the lowering of a luminescence output is the lowering of transmittance of a side surface and a variation in VF (20 mA) was caused by partial corrosion of an alloy layer of the p-type electrode.

TABLE 1

|  | Light-emitting layer | Substrate | VF @20 mA (V) | Output @20 mA (mW) | Wavelength (nm) | Output residual ratio (%) | Change in VF@20 mA (V) |
| --- | --- | --- | --- | --- | --- | --- | --- |
| Example | AlGaInP | GaP | 2.0 | 16 | 660 | 97 | 0 |
| Comparative example | AlGaAs | AlGaAs | 1.9 | 5 | 661 | 77 | 0.2 |

INDUSTRIAL APPLICABILITY

The light-emitting diode according to the invention achieves high-efficiency luminescence and has high reliability even in a high-humidity environment. In particular, the light-emitting diode can be used as a highly-reliable light-emitting diode product which could not been obtained by an existing AlGaAs LED, such as a light source for plant growth.

REFERENCE SIGNS LIST

1: light-emitting diode
2: compound semiconductor layer
2*a*: upper surface
2*b*: side surface
3: functional substrate
3*a*: vertical surface
3*b*: inclined surface
4: n-type ohmic electrode
5: p-type ohmic electrode
5*b*: alloy layer
6: electrode protection layer
7: light-emitting section
8: current diffusion layer
8*a*: upper surface
9: lower cladding layer
10: light-emitting layer
11: upper cladding layer
11*a*: upper surface
12: first protective film
13: second protective film
14: GaAs substrate
15: buffer layer
16: contact layer
41: light-emitting diode lamp
42: mount substrate
43: n-electrode terminal
44: p-electrode terminal
45, 46: gold wire
47: connection layer
48: silicone resin

The invention claimed is:
1. A light-emitting diode comprising:
  a compound semiconductor layer having a pn-junction type light-emitting section which comprises Al in a composition formula and in which a luminescence wavelength is not less than 570 nm and not more than 700 nm;
  an ohmic electrode provided on the main light extraction surface of the compound semiconductor layer;
  and an electrode protection layer for protecting the ohmic electrode, wherein Al concentrations of the surfaces of the compound semiconductor layer which comprise the main light extraction surface are 25% or less, wherein the light-emitting section comprises a light-emitting layer having a composition formula, $(Al_XGa_{1-X})_YIn_{1-Y}P$ ($0 \leq x \leq 1$ and $0 \leq y \leq 1$), the electrode protection layer has a two-layer structure composed of a first protective film provided so as to cover the ohmic electrode and a part of the adjacent main light extraction surface, and a second protective film provided so as to cover at least an end portion of the first protective film without covering the ohmic electrode, the ohmic electrode is covered with the first protective film without being exposed, most of the main light extraction surface that is not in contact with the ohmic electrode is not covered by the first protective film, and the surface of the first protective film is made to be a pad for wire bonding.

2. The light-emitting diode according to claim 1, wherein the ohmic electrode provided on the main light extraction surface is a p-type ohmic electrode.

3. The light-emitting diode according to claim 1, wherein the light-emitting section has a cladding layer on one or both of the upper surface and the lower surface of the light-emitting layer.

4. The light-emitting diode according to claim 1, wherein a composition formula of the surface of the main light extraction surface is $(Al_XGa_{1-X})_YIn_{1-Y}P$ ($0 \leq X \leq 0.8$ and $0.48 \leq Y \leq 0.52$).

5. The light-emitting diode according to claim 1, wherein an n-type ohmic electrode is further provided on the main light extraction surface, and the electrode protection layer is provided on the n-type ohmic electrode.

6. The light-emitting diode according to claim 1, wherein the first protective film is a metal layer made of any one of gold and platinum, or a laminated structure of the metal layers.

7. The light-emitting diode according to claim 6, wherein the surface of the first protective film is gold.

8. The light-emitting diode according to claim 1, wherein the second protective film is an oxide film or a nitride film which is transparent to a luminescence wavelength.

9. The light-emitting diode according to claim 8, wherein the second protective film is silicon oxide ($SiO_2$).

10. The light-emitting diode according to claim 1, wherein a functional substrate is joined to the surface on the opposite side to the main light extraction surface of the compound semiconductor layer, and an Al concentration of the surface of the functional substrate is 25% or less.

11. The light-emitting diode according to claim 10, wherein the functional substrate is transparent to a luminescence wavelength.

12. The light-emitting diode according to claim 10, wherein a material of the functional substrate is GaP.

13. The light-emitting diode according to claim 1, wherein the light-emitting diode is a light-emitting diode for use for the promotion of photosynthesis in plant growth, in which a luminescence wavelength is in a range of 650 nm to 670 nm, and an Al concentration of the surfaces of a semiconductor layer and a substrate is 25% or less and there is no As content with the exception of in a contact layer of an ohmic electrode.

14. A light-emitting diode lamp comprising the light-emitting diode according to claim 1.

15. A lighting equipment comprising the light-emitting diode lamp according to claim 14.

* * * * *